(12) United States Patent
Eloranta (10) Patent No.: US 6,778,115 B2
(45) Date of Patent: Aug. 17, 2004

(54) DIGITAL-TO-ANALOG CONVERTER AND METHOD FOR REDUCING HARMONIC DISTORTION IN A DIGITAL-TO-ANALOG CONVERTER

(75) Inventor: Petri Eloranta, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/276,033

(22) PCT Filed: Mar. 21, 2001

(86) PCT No.: PCT/EP01/03234

§ 371 (c)(1),
(2), (4) Date: Jan. 8, 2003

(87) PCT Pub. No.: WO02/078192

PCT Pub. Date: Oct. 3, 2002

(65) Prior Publication Data

US 2004/0036642 A1 Feb. 26, 2004

(51) Int. Cl.[7] .................................................. H03M 1/66
(52) U.S. Cl. ........................................ 341/144; 341/153
(58) Field of Search ................................. 341/144, 153

(56) References Cited

U.S. PATENT DOCUMENTS

| | | |
|---|---|---|
| 5,689,257 A | 11/1997 | Mercer et al. |
| 6,031,477 A | 2/2000 | Mercer |
| 6,329,940 B1 * | 12/2001 | Dedic ........................ 341/144 |

OTHER PUBLICATIONS

Sumanen L et al:, "A 10–bit high–speed low–power CMOS D/A converter in 0.2mm[2]" IEEE International Conference On Electronics, Circuits And Systems, vol. 1, Sep. 7–10, 1998, pp. 15–18, XP002902146.

14–Bit, 125 MSPS high Performance TxDac® D/A Converter, Analog Devices, Inc. 1999, pp 1–24.

Bostos, et al., "A 12–bit Intrinsic Accuracy High–Speed CMOS DAC", IEEE J. Solid–State Circuits, vol. 33, no. 12, Dec. 1998, pp. 1959–1969.

Vandenbussche, et al., "A 14–bit 150MSample/s Update Rate $Q^2$ Random walk CMOS DAC", Proc. IEEE Int. Solid–State Circuits Conf., Feb. 1999, pp. 146–147.

Van den Bosch, et al., "A 12–bit 200MHz Low Glitch CMOS D/A Converter", Proc. Custom Integrated Circuits Conference, 1998, pp. 249–252.

Bugeja e al., "A 14–bit 100MSample/s CMOS DAC Designed for Spectral Performance", Proc. IEEE Int. Solid–State Circuits Conference, Feb. 1999, pp. 148–149.

Bugeja et al., "A Self–Trimming 14b 100MSample/s CMOS DAC" ISSCC 2000/Session 2/NYQUIST–Rate Data Converters/ Paper mp 2.6, 2000 IEEE International Solid–State Circuits Conference, Feb. 2000, pp. 44–45.

Mercer et al., "12–bit 125MSPS CMOS D/A Designed for Spectral Performance", International Symposium on Low Power Electroncis and Design, 1996, pp. 243–246.

* cited by examiner

Primary Examiner—Peguy JeanPierre
Assistant Examiner—Joseph Lauture
(74) Attorney, Agent, or Firm—Cohen, Pontani, Lieberman & Pavane (57) ABSTRACT

The invention relates to a digital-to-analog converter. In order to reduce distortion in the output, the converter comprises a first and a second current output (OUT, XOUT), at least two current sources (1) and assigned to each of the current sources (1) a current switch circuit. Each current switch circuit comprises means (4, 5, 6, 7) for creating two overlapping complementary control signals out of a signal indicating whether the current source (1) is selected, while in a first group of the current switch circuits the connection of the current source (1) to the current outputs is controlled by one of the control signals respectively, and while in a second group of the current switch circuits the control by the control signals is exchanged, each of the current switch circuits of the second group comprising in addition means (10) for inverting the signal input to the means for creating two overlapping complementary control signal (4, 5, 6, 7).

13 Claims, 7 Drawing Sheets

DIGITAL-TO-ANALOG CONVERTER AND METHOD FOR REDUCING HARMONIC DISTORTION IN A DIGITAL-TO-ANALOG CONVERTER

PRIORITY CLAIM

This is a national stage of PCT application No. PCT/EP01/03234, filed on Mar. 21, 2001. Priority is claimed on that application.

FIELD OF THE INVENTION

The invention relates to a digital-to-analog converter and to a method for reducing harmonic distortion in a digital-to-analog converter.

BACKGROUND OF THE INVENTION

Digital-to-analog (D/A) converters are used in a variety of applications for converting digital signals into corresponding analog signals. They are employed for example in base stations and in radio relay transmitters. The purity of the analog output signal is often of great significance for the performance of the application.

In current-steering D/A converters, the analog output signal is formed by connecting a number of current sources to a current output. In most of the applications, each current source is steered to one of two current outputs, resulting in a differential output signal current.

Figure 1:
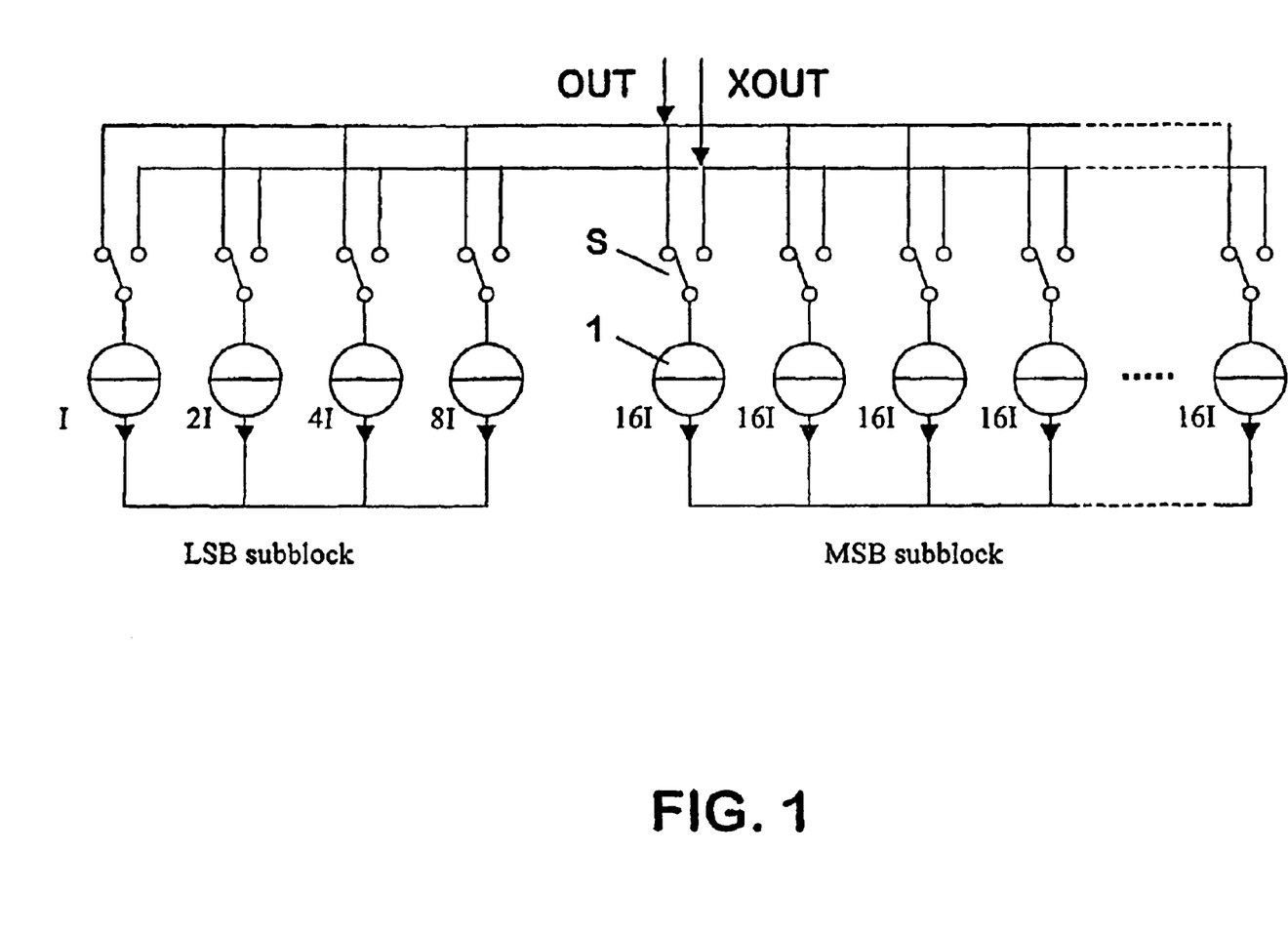
FIG. 1 shows the general structure of a segmented current steering D/A converter.

FIG. 1 shows as an example a segmented current steering 10-bit D/A converter with a 6-bit MSB (most significant bits) block formed of 63 unweighted current sources 1 and a 4-bit LSB (least significant bits) block formed of four binary-weighted current sources. To each current source there is assigned a differential switch pair S controlled by a current switch circuit and used to steer the respective current source to one of two current outputs OUT and XOUT. The four current sources of the LSB block output a one-, two-, four- and eight-fold predetermined current respectively if selected, thereby enabling an output of 8 different current values. Each of the current sources of the MSB block outputs a 16-fold predetermined current if selected. Each current source of the MSB block is responsible for a stepwise increase of the output current signal by a 16-fold predetermined current 16I when selected, thereby enabling an output of 64 different current values. The currents of the MSB and the LSB blocks are summed to form the output signal.

Today it is possible to design an integrated current steering D/A converter for sampling frequencies of up to several hundreds of megasamples per second with a resolution of up to 14 bit. However, with resolutions of 10 bit or more, the full resolution bandwidth is limited to several megahertz. In telecommunications applications a signal bandwidth of several megahertz is required.

The limiting factor for an effective resolution with high frequency signals is distortion. Timing errors and code dependency of the output impedance contribute to distortion. The most common cause of distortion, however, is asymmetrical glitches that occur during the state changes in the differential switches. If the resolution of a D/A converter is equal to or more than 10 bit, distortion starts to limit the dynamic linearity rapidly after some critical point of usually less than 10 MHz.

Figure 2:
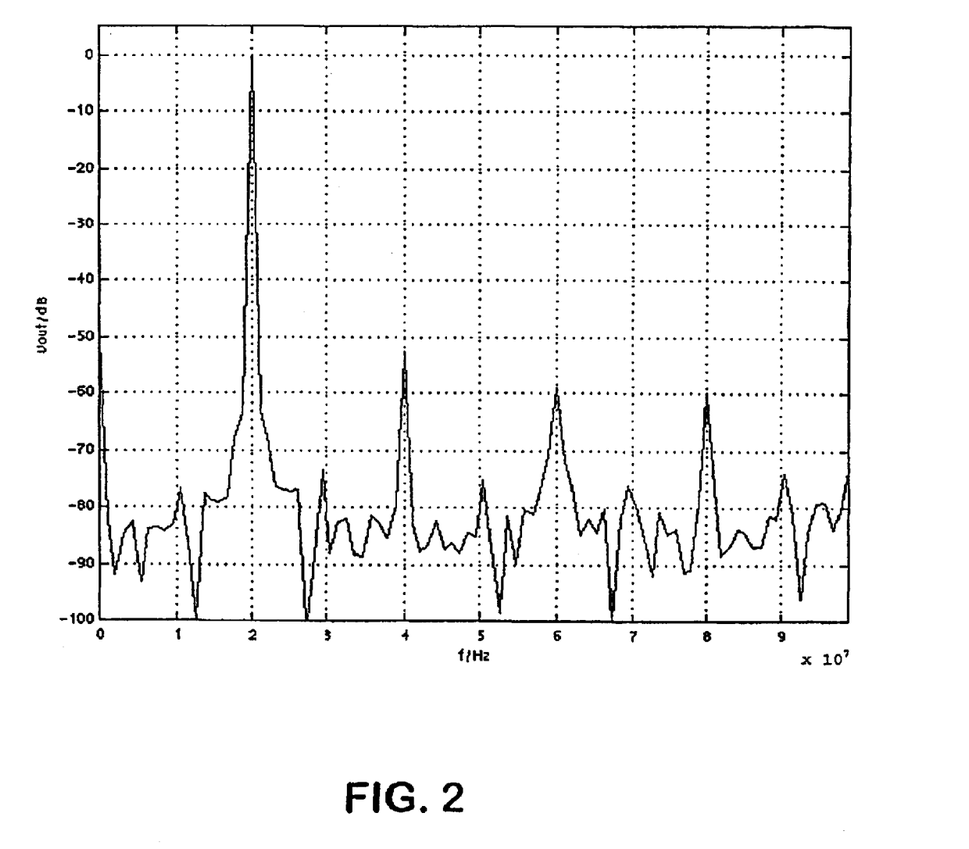
FIG. 2 shows the simulated spectrum of an output signal of a 10-bit D/A converter without compensation.

For illustration, FIG. 2 shows a simulated spectrum of the D/A converter of FIG. 1, the output voltage $V_{out}$ being depicted over the frequency f/Hz of the outputted signal. The used sampling rate is 200 MHz and the signal frequency 20 MHz. Even though the output signal is differential, the even order harmonic components are high. The $2^{nd}$ order harmonic limits the SFDR (spurious free dynamic range) to 53 dB. This illustrates that the differential output is not symmetrical in practice.

Attempts to improve the spectrum are known from the state of the art. Most published methods focus on decreasing the glitch energy in order to improve the spectral purity, but the $2^{nd}$ harmonic component can still appear in the spectrum. Moreover, the $2^{nd}$ harmonic usually dominates the distortion. Such methods are described for example in Analog Devices AD9754 Datasheet: "14-bit, 125MSPS High Performance TxDAC D/A Converter", Analog Devices, Inc., 1999; J. Bastos, A. M. Marques, M. S. J. Steyaert, W. Sansen: "A 12-bit Intrinsic Accuracy High-Speed CMOS DAC", IEEE J. Solid-State Circuits, vol. 33, no. 12, December 1998, pp. 1959–1969; J. Vandenbussche, G. Van der Plas, A. Van den Bosch, W. Daems, G. Gielen, M. Steyaert, W. Sansen: "A 14-bit 150 MSamples/s Update Rate $Q^2$ Random walk CMOS DAC", Proc. IEEE Int. Solid-State Circuits Conf., February 1999, pp. 146–147; and A. Van den Bosch, M. Borremans, J. Vandenbussche, G. Van der Plas, A. Marques, J. Bastos, M. Steyaert, G. Gielen, W. Sansen: "A 12-bit 200 MHz Low Glitch CMOS D/A Converter", Proc. Custom Integrated Circuits Conference, 1998, pp. 249–252.

Another proposed possibility is to use track-and-hold circuitry in the output, as disclosed in A. R. Bugeja, B. -S. Song, P. L. Rakers, S. F. Gilling: "A 14-bit 100 MSamples/s CMOS DAC Designed for Spectral Performance", Proc. IEEE Int. Solid-State Circuits Conference, February 1999, pp. 148–149 and A. Bugeja, B. -S. Song: "A Self-Trimming 14b 100 MSample/s CMOS DAC", Proc. IEEE Solid-State Circuits Conference, February 2000, pp. 44–45. The settled signal from the output is tracked so that the state change phase cannot be seen in the output signal. The usage of a track-and-hold circuit in the output increases the complexity of the D/A converter and the current consumption and is not very practical in mobile terminal units. In addition the speed of the system is limited by the sampling circuitry.

Finally, a few published solutions, like U.S. Pat. No. 6,031,477 and D. A. Mercer, L. Singer: "12-bit 125MSPS CMOS D/A Designed For Spectral Performance", International Symposium on Low Power Electronics and Design, 1996, pp. 243–246, focus on improving the timing accuracy in the single current switch circuits. With these methods, however, there remains some finite signal frequency dependent distortion.

SUMMARY OF THE INVENTION

It is an object of the invention to reduce distortion in the output of a segmented current steering D/A converter.

The object is reached on the one hand by a digital-to-analog converter comprising a first and a second current output, at least two current sources, the currents of the current sources being summed to form an analog output signal, and assigned to each of the current sources a current switch circuit for connecting the respective current source to the first current output if the current source is selected according to a digital input signal and for connecting the respective current source to the second current output if the current source is not selected according to the digital input signal, each current switch circuit comprising means for creating two overlapping complementary control signals out of a signal indicating whether the current source is selected, while in a first group of the current switch circuits the connection of the respective current source to the first current output is controlled by the first one of the overlapping control signals and the connection of the current source to the second current output is controlled by the second one of the overlapping control signals, and while in a second group of the current switch circuits the connection of the respective current source to the first current output is controlled by the second one of the overlapping control signals and the connection of the current source to the second current output is controlled by the first one of the overlapping control signals, each of the current switch circuits of the second group comprising in addition means for inverting the signal input to the means for creating two overlapping complementary control signals.

On the other hand, the object is reached by a method for reducing harmonic distortion in a digital-to-analog converter comprising a first and a second current output, at least two current sources, the currents of the current sources being summed up to form an analog output signal, and assigned to each of the current sources a current switch circuit for connecting the respective current source to the first current output if the current source is selected according to a digital input signal and for connecting the respective current source to the second current output if the current source is not selected according to the digital input signal, the method comprising creating for each current source of a first group of current sources two overlapping control signals based on a signal indicating whether the respective current source is selected, and using the first of said overlapping control signals for controlling the connection of the current source to the first current output and the second of said overlapping control signals for controlling the connection of the current source to the second current output; and creating for each current source of a second group of current sources two overlapping control signals based on a signal which is inverted compared to the signal indicating whether the respective current source is selected, and using the first of said overlapping control signals for controlling the connection of the current source to the second current output and the second of said control signals for controlling the connection of the current source to the first current output.

According to the invention, a certain number of current switch circuits assigned to the current sources of a D/A converter is divided into two groups. The first group switches the respective current source to a first or a second current output conventionally. To this end, the current switch circuits create overlapping control signals out of an information indicating whether the current source is presently selected. The current switch circuits of the second group, however, are modified. The connection of the outputs of the means for creating overlapping signals to the actual switching means is switched. Additionally, the signal entering the means for creating overlapping signals is inverted. As a result, the connections between the current source and the first and the second current output are controlled with signals of the same state as if a current switching circuit of the first group were employed, when disregarding the overlaps. The asymmetry of the overlaps, however, is changed.

Since part of the state changes now occur in a complementary way as compared to the other part of the state changes, the asymmetrical glitches occurring during the state changes in the switches are compensated in the summed up analog output signal. This means that the distortion caused by the pulse relation errors in the control signals spreads to the noise floor or at least decreases significantly.

It is an advantage of the invention that is does not necessitate an increase in the current consumption. Nor is the circuit complexity increased, since only an inverter has to be added to realize the modified current switch cells. Another significant advantage is given by the fact that there is no signal frequency dependency of the compensation according to the invention.

Preferred embodiments of the invention become apparent from the subclaims.

Many D/A converters comprise weighted, in particular binary-weighted, current sources for converting the least significant bits (LSB) of a digital signal and unweighted current sources for converting the most significant bits (MSB) of a digital signal. In such a converter it is preferred that only the current switch circuits assigned to the unweighted current sources are divided into two groups for a complementary controlling of the connection of the current sources to a first and a second current output. The weighted current sources are controlled conventionally, because they have different impacts on the resulting asymmetry.

Preferably, the two groups of current switch circuits are basically of equal size in order to achieve an optimal compensation.

In an advantageous embodiment of the invention, two parallel arrays of current sources are employed. These two arrays are used simultaneously, i.e. with each change of state (at least) one current source of each array is switched at the same time. The current switch circuits assigned to the current sources of the first array all belong to the first group, the current switch circuits assigned to the current sources of the second array all belong to the second group of current switch circuits. Accordingly, in every switch transition both a modified and an unmodified cell switches at the same time. This leads to an even better compensation of the asymmetries, since the compensation takes place immediately and exactly matched with each switch and since an uneven distribution of carried out switches is irrelevant in this implementation. Moreover, this embodiment of the invention is also suitable for including the weighted current sources in the compensation, since the asymmetries caused by the switching of a current source in the first array are always compensated by the switching of an equal current source of the second array.

The digital-to-analog converter and the method according to the invention are especially suited to be used in base stations and radio relay transmitters.

BRIEF DESCRIPTION OF THE FIGURES

In the following, the invention is explained in more detail with reference to drawings, of which

DETAILED DESCRIPTION OF THE INVENTION

The segmented current steering D/A converter of FIG. 1 and the spectrum of the output signal of FIG. 2 have already been described above. The 10-bit D/A converter of FIG. 1 is also the basis for the described embodiment of the invention.

Figure 3A:
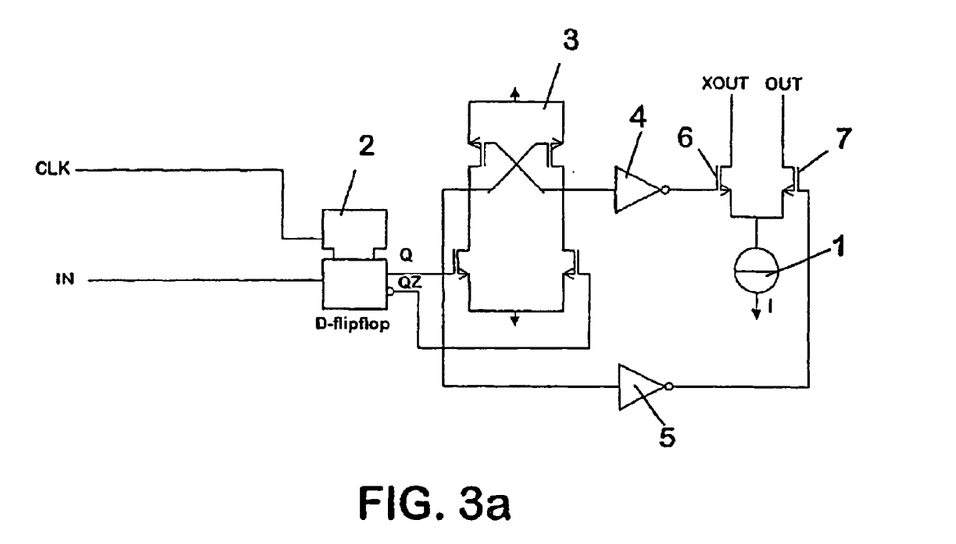
FIG. 3a shows a known current switch employed in an embodiment of the invention.
Figure 3B:
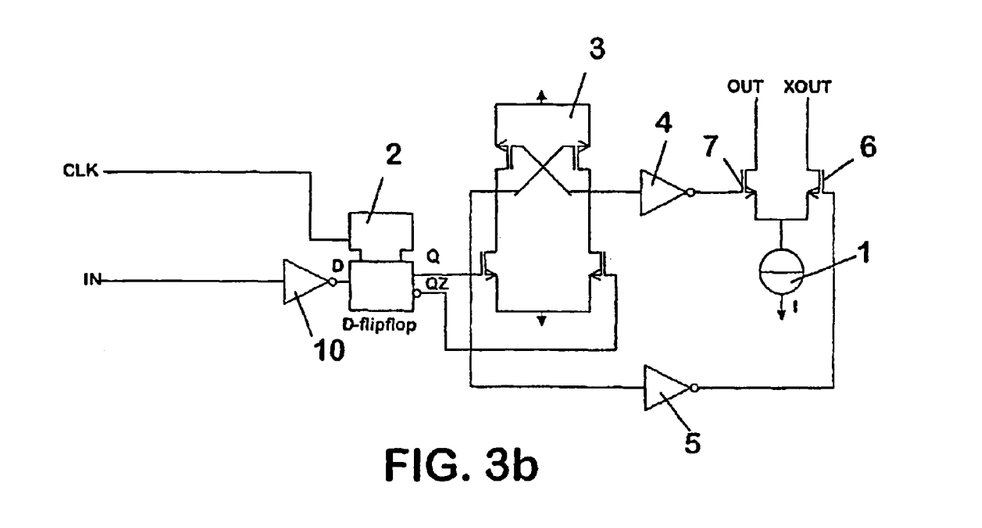
FIG. 3b shows a modified current switch employed in an embodiment of the invention.

FIGS. 3a and 3b schematically show a first and a second current switch cell in a current steering D/A converter of FIG. 1. In both cells, a current switch circuit is used for the steering of one of the current sources 1 of the MSB-block of FIG. 1 by controlling a differential switch pair S.

Figure 4:
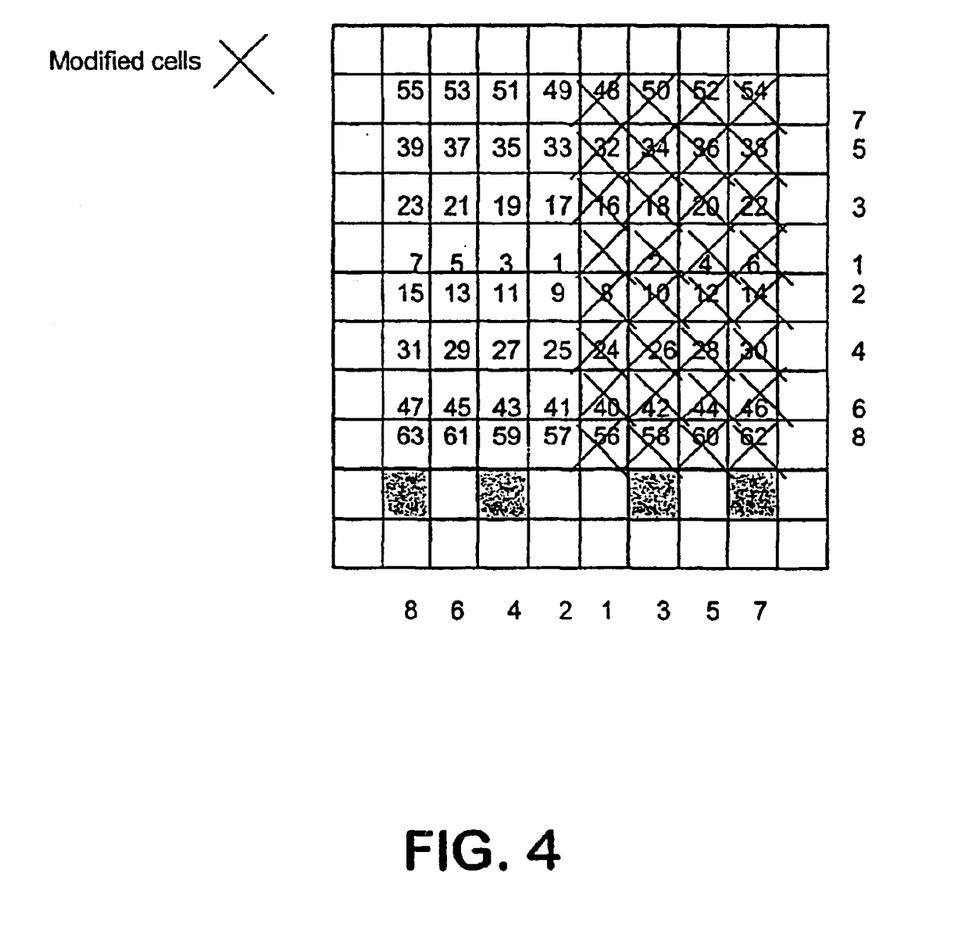
FIG. 4 shows the switching order of a 6-bit block of current sources in an embodiment of the invention.

Each of the current sources 1 of the MSB block of FIG. 1 is destined to output a differential current depending on the 6-bit MSB part in a digital signal that is to be converted into an analog signal. One example of determining the switching order of the current sources 1 can be taken from FIG. 4, in which each of the 63 current sources is defined as a cell in a matrix by a pair of a column 1–8 and a row 1–8. Each of the current sources 1 belonging to columns 8, 6, 4 and 2 in FIG. 4 is connected by a first current switch circuit according to FIG. 3a to one of the current outputs OUT, XOUT. Each of the current sources 1 belonging to one of columns 1, 3, 5 and 7 in FIG. 4 is connected by a second current switch circuit according to FIG. 3b to one of the current outputs OUT, XOUT. The cells corresponding to the latter current sources 1 are marked with an X in FIG. 4. The 6-bit MSB signals can be decoded into 64 decoded signals. These 64 signals can then control all 63 switching cells.

In FIG. 3a, an input line providing an input signal IN is connected the input of a D-flipflop 2 which receives additionally at its timing input a clock signal CLK. The two complementary output signals of the D-flipflop Q and QZ are input to a latch circuit 3 the output lines of which are both connected to a respective inverter 4, 5. The output of each of the inverters 4, 5, finally, is coupled to the base of one of two transistors 6, 7 forming a differential switch pair S. The transistors 6, 7 are suitable to connect a current source 1 to one of two different current outputs OUT and XOUT respectively.

The current switch circuit of FIG. 3a is used for steering half of the current sources 1 of the MSB block of FIG. 1 and works as follows:

The input signal IN indicates in accordance with the 6 bit MSB part of the present 10-bit digital signal whether a current source has to be selected to provide a current. If the current source is to be selected, a high input signal IN is input to the D-flipflop 2, otherwise a low input signal IN. The D-flipflop 2 synchronizes the signal IN with the rising edge of the clock signal CLK and outputs the synchronized signal Q and a complementary synchronized signal QZ. The synchronized signal Q and complementary synchronized signal QZ are fed to the latch circuit 3 and the inverters 4, 5 which are used to generate overlapping control signals for the transistors 6, 7 of the differential switch pair S.

The differential switch pair S connects the current source 1 to one of the current outputs OUT and XOUT according to the overlapping control signals. Since the control signals are overlapping, the connection of the current source 1 to one or the other of the current outputs OUT, XOUT is overlapping as well, i.e. for a short period of time after each switch, the current source 1 is connected to both current outputs OUT, XOUT in parallel. This way a period of time without connection to one of the current outputs OUT, XOUT because of timing delays in one of the control signals is prevented. That means that the switching waveforms are overlapping in order to prevent the current source to drop out of its saturation region. The overlaps are different for the two switching direction OUT to XOUT and XOUT to OUT which leads to the harmonic distortions described with reference to the state of the art and depicted in the simulated spectrum of FIG. 2, if the current switch circuit of FIG. 3a is employed for all current sources 1 of the D/A converter.

The current switch circuit of FIG. 3b comprises the same elements 2–7 as the current switch circuit of FIG. 3a. In addition, an inverter 10 is inserted between the input line and the input of the D-flipflop 2. Moreover, the overlapping control signals generated by the latch circuit 3 and the inverters 4, 5 are each fed to the opposite transistors 7, 6 as compared to FIG. 3a.

The current switch circuit of FIG. 3b works analogously to the current switch circuit of FIG. 3a, except that instead of the input signal IN, an inverted signal D is fed to the D-flipflop 2 and that the overlapping control signals control the opposite transistors 7, 6 of the differential switch pair S as compared to FIG. 3a. As a result of the inversion of the input signal IN on the one hand and the changed access of the overlapping control signals to the differential switch pair S on the other hand, the differential switch pair S is basically controlled by signals of the same value as in FIG. 3a. And also in a current switch circuit of FIG. 3b, the overlaps of the overlapping control signals are asymmetric. But the lengths of the overlaps for a switch from current output OUT to current output XOUT and from current output XOUT to current output OUT are exchanged compared to the lengths of the overlaps of the overlapping control signals in FIG. 3a.

Therefore, when employing a current switch circuit of FIG. 3a for half of the current sources 1 of the MSB block and a current switch circuit of FIG. 3b for the other half of the current sources 1 of the MSB block, half of the state changes are complementary to the state changes of the other half. As a result, the distortion caused by the pulse relation errors in the control signals spreads into the noise floor.

Figure 5:
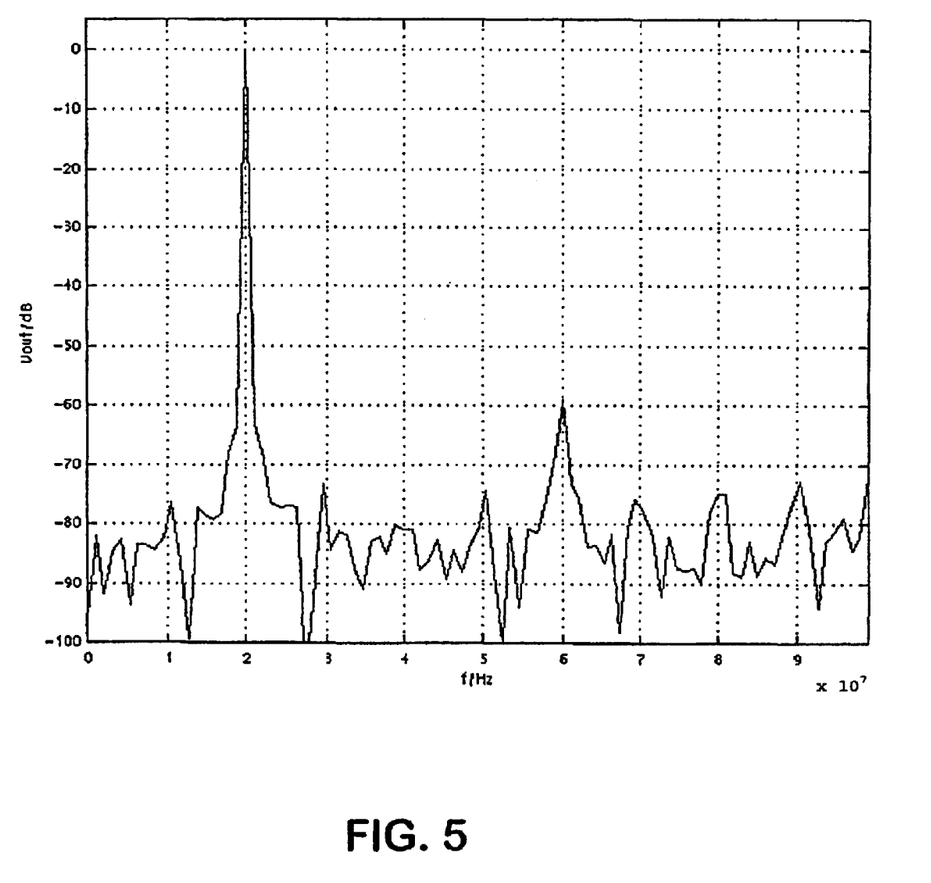
FIG. 5 shows a simulated spectrum of an output signal of a 10-bit D/A converter with compensation according to the invention.

FIG. 5 shows a simulated spectrum of a 10-bit D/A converter of FIG. 1 employing the control switch circuits of FIGS. 3a and 3b for the 63 current sources of the 6-bit MSB block, the sampling rate being 200 MHz and the signal frequency 20 MHz. The different control switch circuits were distributed to the current sources as indicated in FIG. 4. The output voltage $V_{out}$ of the D/A converter is depicted over the frequencies of the generated analog output.

When comparing the spectrum of FIG. 5 with the spectrum of FIG. 2 which is based on the same 10-bit D/A converter except that a current switch circuit of FIG. 3a was used for all current sources 1 of the 6-bit MSB block, the improvement is obvious. The $2^{nd}$ harmonic component cannot be distinguished anymore from the noise floor and the $3^{rd}$ harmonic component which is now dominating limits the SFDR from 53 dB to 59 dB.

There is still some distortion left due to the uncompensated binary-weighted 4-bit LSB block.

The compensation is simple and does not increase the complexity of the circuit and it can easily be transferred to higher resolution converters. For high resolution converters two or more unweighted current source arrays can be used.

The compensation of asymmetries according to the invention was also tested in a 13-bit D/A converter with a 7-bit MSB part to verify its suitability in high-resolution D/A converters.

Figure 6:
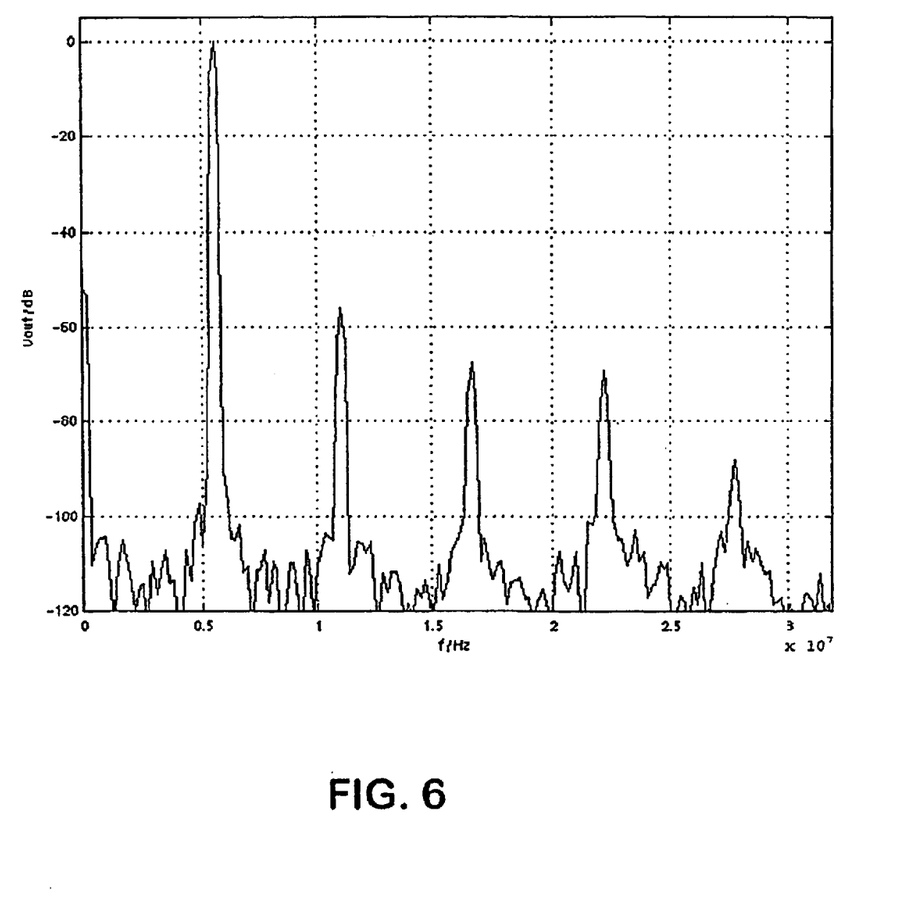
FIG. 6 shows a simulated spectrum of an output signal of a 13-bit D/A converter without compensation.

FIG. 6 shows the simulated spectrum of a 13-bit D/A converter without compensation. The sample rate was 67 MHz and the signal frequency 5.5 MHz. As can be seen in the figure, the dominating $2^{nd}$ harmonic component is down 56 dB from the main signal.

Figure 7:
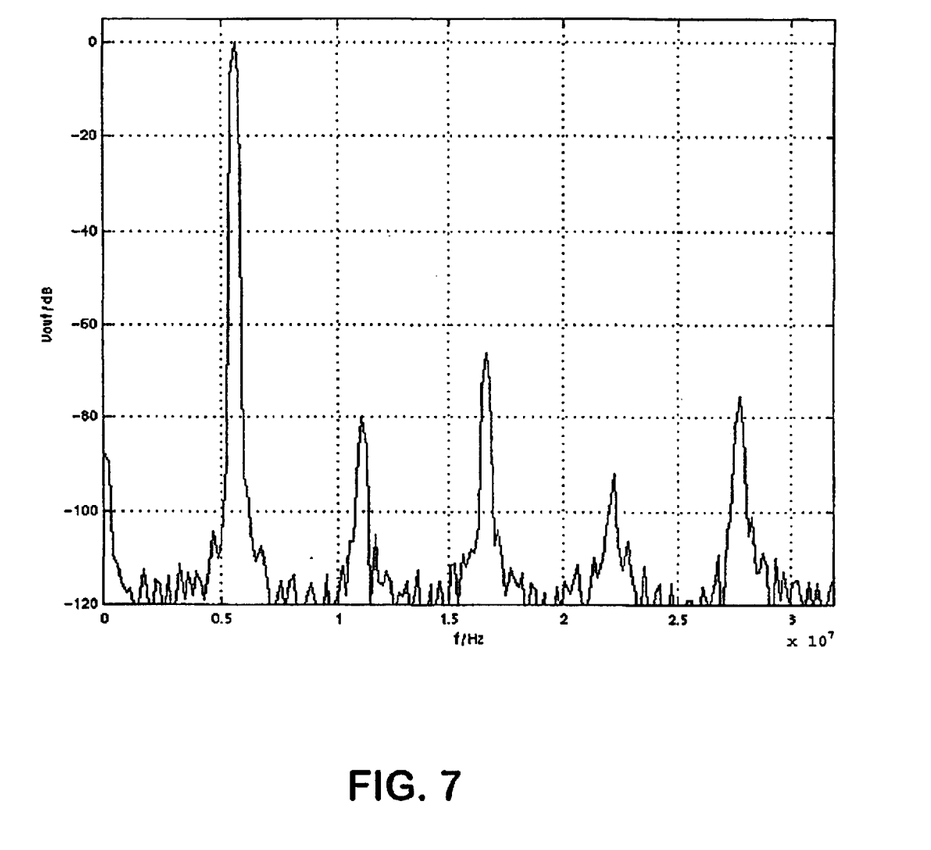
FIG. 7 shows a simulated spectrum of a 13-bit D/A converter with compensation according to the invention.

FIG. 7 shows in contrast the simulated spectrum of a 13-bit D/A converter with a compensation according to the invention. The $3^{rd}$ harmonic component is now dominating with an SFDR of 67 dB, the $2^{nd}$ harmonic component being reduced to an SFDR of 80 dB. Accordingly, it was possible to achieve a significant improvement with the compensation according to the invention also in a 13-bit D/A converter, even though the used converter was not designed optimally for high-speed applications and even though there was again no compensation for the 4 current sources responsible for the 4-bit LSB part of the digital signals.

What is claimed is:

1. A digital-to-analog converter comprising:
   a first and a second current output (OUT, XOUT);
   at least two current sources (1), the currents of the current sources (1) being summed to form an analog output signal; and
   a plurality of current switch circuit, wherein each switch circuit is assigned to one of the current sources (1) and is for connecting its respective current source (1) to the first current output (OUT) if the current source is selected according to a digital input signal and for connect the respective current source (1) to the second current output (XOUT) if the current source (1) is not selected according to the digital input signal, wherein each current switch circuit comprises:
      means (4, 5, 6, 7) for creating two overlapping complementary control signals out of a signal (IN) indicating whether the current source (1) is selected; wherein said plural switch circuits comprise:
         a first group in which a connection of the respective current source (1) to the first current output (OUT) is controlled by a first one of the overlapping control signals and a connection of the current source (1) to the second current output (XOUT) is controlled by a second one of the overlapping control signals; and
         a second group in which the connection of the respective current source (1) to the first current output (OUT) is controlled by the second one of the overlapping control signals and the connection of the current source (1) to the second current output (XOUT) is controlled by the first one of the overlapping control signals, wherein each of the current switch circuits of the second group further comprises:
            means (10) for inverting the signal (IN), thereby generating a signal (D), which is input to the means for creating two overlapping complementary control signals.

2. The digital-to-analog converter according to claim 1, wherein each current switch circuit further comprises:
   a clock input for inputting a clock signal (CLX): and
   a means (2) for synchronizing the signal (IN or D) with the clock signal (CLX), before providing it to the means for creating two overlapping complementary control signals.

3. The digital-to-analog converter according to claim 2, wherein the means (2) for synchronizing the signal (IN or D) with the clock signal (CLK) outputs a synchronized signal (Q) and a complementary synchronized signal (QZ), and the two overlapping complementary control signals are created out of the synchronized signal (Q) and the complementary synchronized signal (QZ).

4. The digital-to-analog converter according to claim 2, wherein the means (2) for synchronizing the signal (IN or D) with the clock signal (CLK) comprises:
   a D-flipflop receiving at its signal input the signal (IN or D) and at its clock input the clock signal (CLK), wherein the clock signal (CLK) is equal for all current switch circuits of the digital-to-analog converter, and the D-flipflop synchronizes said signal IN or D with the rising edge of the clock signal (CLK).

5. The digital-to-analog converter according to claim 1, wherein the means for creating two overlapping complementary control signals comprises:
   a latch circuit (3) with an inverter (4, 5) connected to each of its outputs.

6. The digital-to-analog converter according to claim 1, wherein the current switch circuits comprising the first group and the second group are assigned to unweighted current sources (1).

7. The digital-to-analog converter according to claim 1, wherein there are unweighted and weighted current sources, and only the current switch circuits assigned to the unweighted current sources (1) comprise the first group and the second group.

8. The digital-to-analog converter according to claim 1, wherein the number of current switch circuits in the first group is basically the same as the number of current switch circuits in the second group.

9. The digital-to-analog converter according to claim 1, wherein the at least two current sources comprise:
   a double array of current sources (1), wherein current sources (1) of one array are switched by the first group of current switch circuits and current sources (1) of the other array are switched by the second group of current switch circuits, each current source (1) of one of the arrays being switched simultaneously to one current source (1) of the other array.

10. The digital-to-analog converter according to claim 1, wherein the digital-to-analog converter is an integrated digital-to-analog converter.

11. A base station comprising the digital-to-analog converter according to claim 1.

12. A radio relay transmitter comprising the digital-to-analog converter according to claim 1.

13. A method for reducing harmonic distortion in a digital-to-analog converter, wherein the digital-to-analog converter comprises a first and a second current output (OUT, XOUT) a plurality of current sources (1), the currents of the plural current sources (1) being summed up to form an analog output signal, and a plurality of current switch circuits, each current switch element being assigned to one of the plural current sources (1) and being for connecting its respective current source (1) to the first current output (OUT) if the current source (1) is selected according to a digital input signal and for connecting the respective current source (1) to the second current output (XOUT) if the current source (1) is not selected according to the digital input signal, the method comprising the steps of:
   creating, for each current source (1) assigned to a first group of the plural current sources, two overlapping control signals based on a signal (IN) indicating whether the respective current source (1) is selected, and using a first of said overlapping control signals for controlling a connection of the current source (1) to the first current output (OUT) and a second of said overlapping control signals for controlling a connection of the current source (1) to the second current output (XOUT); and
   creating, for each current source (1) assigned to a second group of the plural current sources two overlapping control signals based on a signal (D) which is inverted compared to the signal (IN) is selected, and using a first of said overlapping control signals for controlling a connection of the current source (1) to the second current output (XOUT) and a second of said control signals for controlling a connection of the current source (1) to the first current output (OUT).

* * * * *